(12) United States Patent
Lee et al.

(10) Patent No.: US 10,666,118 B2
(45) Date of Patent: May 26, 2020

(54) PRINTED CIRCUIT BOARD AND MOTOR DRIVE APPARATUS INCLUDING THE PRINTED CIRCUIT BOARD

(71) Applicant: LG ELECTRONICS INC., Seoul (KR)

(72) Inventors: Jungdae Lee, Seoul (KR); Jongwon Kim, Seoul (KR); Kyunghoon Lee, Seoul (KR); Gilsu Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 1032 days.

(21) Appl. No.: 14/978,844

(22) Filed: Dec. 22, 2015

(65) Prior Publication Data

US 2016/0181894 A1     Jun. 23, 2016

(30) Foreign Application Priority Data

Dec. 22, 2014   (KR) ........................ 10-2014-0186218

(51) Int. Cl.
*H02K 11/33*     (2016.01)
*H02K 11/02*     (2016.01)
*H05K 1/18*     (2006.01)
*H05K 1/09*     (2006.01)
*H05K 1/11*     (2006.01)
(Continued)

(52) U.S. Cl.
CPC ............. *H02K 11/33* (2016.01); *H02K 11/02* (2013.01); *H02K 11/25* (2016.01); *H05K 1/0201* (2013.01); *H05K 1/0207* (2013.01); *H05K 7/1432* (2013.01); *H05K 1/0203* (2013.01); *H05K 2201/10022* (2013.01); *H05K 2201/10151* (2013.01); *H05K 2201/10166* (2013.01)

(58) Field of Classification Search
CPC ........ H02K 11/33; H02K 11/25; H02K 11/02; H05K 1/0201; H05K 1/0207; H05K 7/1432
USPC .......................... 310/72, 68 C; 361/712, 748
See application file for complete search history.

(56) References Cited

FOREIGN PATENT DOCUMENTS

EP     2 651 015     10/2013
EP     2651015 A1 * 10/2013
(Continued)

OTHER PUBLICATIONS

European Search Report dated May 30, 2016 issued in Application No. 15201535.0.
(Continued)

*Primary Examiner* — Timothy J Thompson
*Assistant Examiner* — Amol H Patel
(74) *Attorney, Agent, or Firm* — KED & Associates LLP

(57) ABSTRACT

Embodiments provide a printed circuit board including a copper foil layer to form a circuit pattern on a base layer, and an insulation layer laminated on the copper foil layer, and wherein the circuit pattern includes a solder pattern, to which an inverter switch element is soldered to supply drive power to a motor, a heat radiation pattern spaced apart from the solder pattern and to contact with one surface of the inverter switch element so as to absorb and radiate heat in the inverter switch element, a heat circulation pattern, through which the heat absorbed by the heat radiation pattern is circulated, and an element pattern formed on both sides of the heat circulation pattern to allow a thermistor element, a resistance value of which is varied according to the heat, to be soldered to the element pattern.

9 Claims, 6 Drawing Sheets

(51) Int. Cl.
*H02K 11/25* (2016.01)
*H05K 7/20* (2006.01)
*H05K 1/02* (2006.01)
*H05K 7/14* (2006.01)

(56) References Cited

FOREIGN PATENT DOCUMENTS

| JP | 2003-219686 | | 7/2003 |
|----|----|----|----|
| JP | 2003219686 A | * | 7/2003 |
| JP | 2011-033479 | | 2/2011 |
| JP | 2011033479 A | * | 2/2011 |
| JP | 2011-259539 | | 12/2011 |
| JP | 2014-116329 | | 6/2014 |
| KR | 10-0726646 | | 6/2007 |
| WO | WO 2012/137597 | | 10/2012 |

OTHER PUBLICATIONS

Korean Notice of Allowance dated Jul. 22, 2016 issued in Application No. 10-2014-0186218.

* cited by examiner

PRINTED CIRCUIT BOARD AND MOTOR DRIVE APPARATUS INCLUDING THE PRINTED CIRCUIT BOARD

CROSS-REFERENCE TO RELATED APPLICATION

This application claims priority under 35 U.S.C. § 119 to Korean Patent Application No. 10-2014-0186218, filed on, Dec. 22, 2014, in the Korean Intellectual Property Office, whose entire disclosure is hereby incorporated by reference.

BACKGROUND

1. Field

Embodiments relate to a printed circuit board and a motor drive apparatus including the printed circuit board.

2. Background

In general, a vacuum cleaner creates a suction state in the interior of a main body by driving a motor, thus causing, for example, dust to be suctioned to the interior of the main body by suction force. To this end, the motor used in the vacuum cleaner may be driven by drive power supplied from an inverter which includes three-phase switch elements. The three-phase switch elements or three-phase switches (hereinafter "three-phase switch elements") show an increase in the number of switching times according to the drive time and the drive speed of the motor, and heat may be generated inside the elements.

Because the three-phase switching elements described above are mounted on a printed circuit board, a copper foil layer may be formed on the printed circuit board so as to absorb and radiate the heat in the three-phase switch elements. In recent years, in order to sense whether the three-phase switch elements are damaged or rendered nonfunctional by the heat generated therein, studies have been conducted to measure the heat in the three-phase switch elements.

BRIEF DESCRIPTION OF THE DRAWINGS

The embodiments will be described in detail with reference to the following drawings in which like reference numerals refer to like elements wherein.

DETAILED DESCRIPTION

Figure 1:
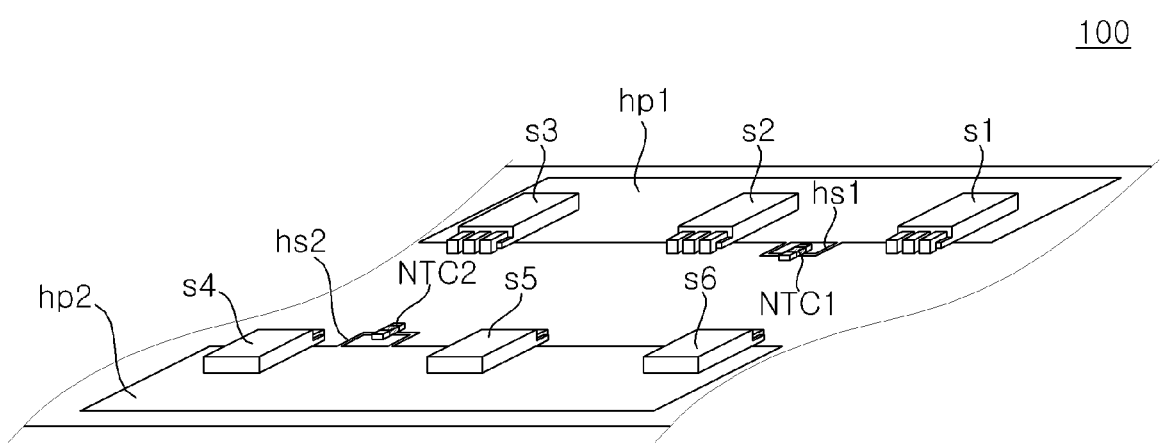
FIG. 1 is a perspective view illustrating a portion of a printed circuit board according to an exemplary embodiment.
Figure 2:
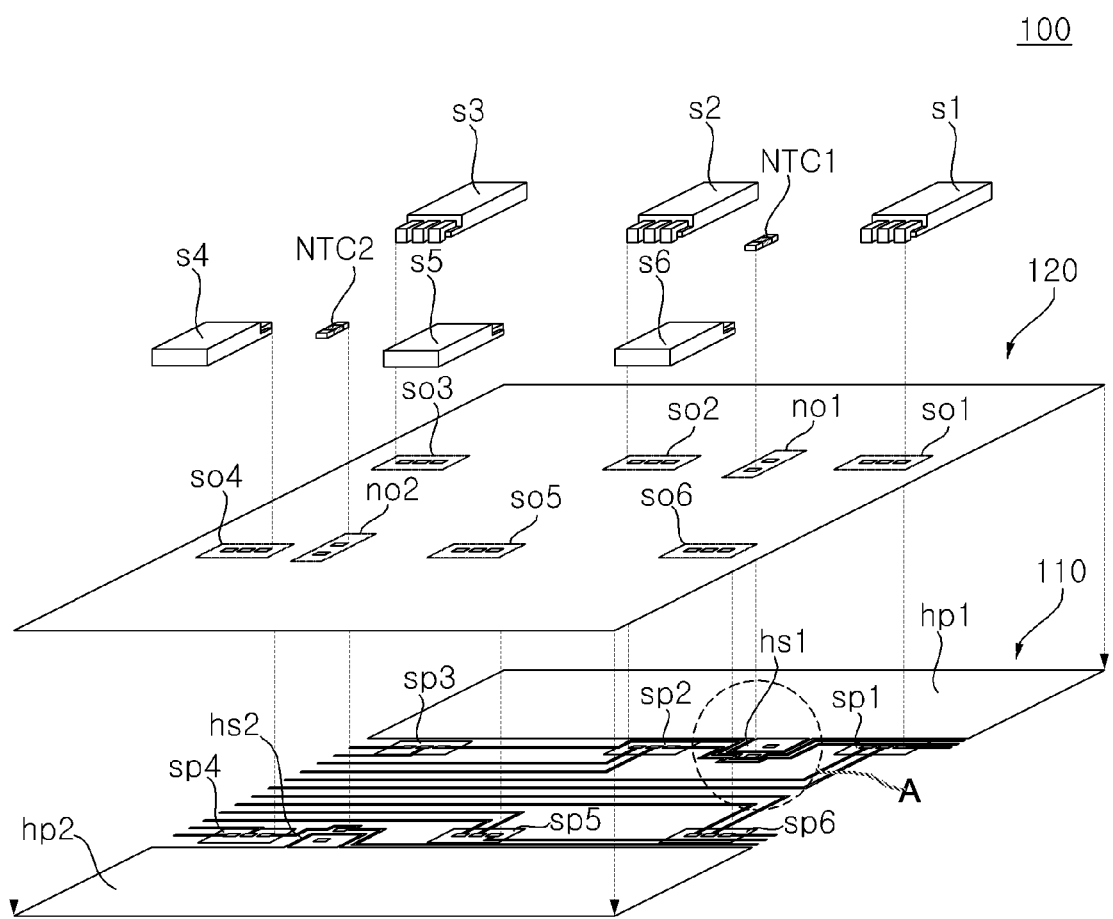
FIG. 2 is an exploded perspective view illustrating the printed circuit board of FIG. 1.

FIG. 1 is a perspective view illustrating a portion of a printed circuit board according to an exemplary embodiment, and FIG. 2 is an exploded perspective view illustrating the printed circuit board of FIG. 1. The printed circuit board 100 illustrated in FIGS. 1 and 2 indicates an inverter unit or module, which supplies drive power to a motor. Although the description of the embodiment is directed to the inverter unit, the description may be applied to other units that are at risk of being damaged by heat generation, without limitation to the inverter unit.

The printed circuit board 100 may be provided with three-phase switch elements s1, s2, s3, s4, s5 and s6 for an inverter, and a thermistor or thermistor element NTC 1. The printed circuit board 100 may include a base layer, a copper foil layer 110 having a circuit pattern provided on the base layer, and an insulation layer 120 on the copper foil layer 110. The base layer may be formed of an FR4 material, insulating material or a metal material. In the following description of the embodiment, the base layer will be described as being formed of the FR4 material.

The copper foil layer 110 may include solder patterns sp1, sp2, sp3, sp4, sp5 and sp6, and the three-phase inverter switch or switch elements s1, s2, s3, s4, s5 and s6 for the supply of drive power to the motor are soldered to the solder patterns. Heat radiation patterns hp1 and hp2 are spaced apart from the solder patterns sp1, sp2, sp3, sp4, sp5 and sp6 and provided under the respective three-phase switch elements s1, s2, s3, s4, s5 and s6 so as to absorb and radiate heat generated by the three-phase switch elements s1, s2, s3, s4, s5 and s6.

The circuit pattern further includes a heat circulation pattern or a heat conduction pattern hs1, through which the heat absorbed by the heat radiation patterns hp1 is circulated/conducted, and element patterns or contact pattern formed on both sides of the heat circulation pattern hs1, to which the thermistor element NTC1 is soldered such that the resistance value of the thermistor element NTC1 is varied according to the heat circulating/conducted through the heat circulation patterns hs1.

The solder patterns sp1, sp2, sp3, sp4, sp5 and sp6 may be soldered to three terminals of the three-phase switch elements s1, s2, s3, s4, s5 and s6. In the embodiment, the three-phase switch elements s1, s2, s3, s4, s5 and s6 may be field effect transistors (FETs). The FET may include a drain, a gate and a source, and may conduct current between the drain and the source in response to a gate signal input to the gate, thereby generating a PWM signal and supplying the same to the motor.

Each of the solder patterns sp1, sp2, sp3, sp4, sp5 and sp6 may be connected to three terminals of a corresponding one of the three-phase switch elements s1, s2, s3, s4, s5 and s6, and may include a signal line through which a gate signal is applied to the gate of each of the three-phase switch elements s1, s2, s3, s4, s5 and s6. The drain and the source may be configured for coupling to prescribed voltages.

The heat radiation pattern hp1 may come into contact with a surface that is common to all of the three-phase switch elements s1, s2 and s3, thereby absorbing and radiating heat in the three-phase switch elements s1, s2 and s3. Likewise, the heat radiation pattern hp2 may come into contact with a single surface that is common to all of the three-phase switch elements s4, s5 and s6, thereby absorbing and radiating heat in the three-phase switch elements s4, s5 and s6.

The heat circulation pattern hs1 may be connected to the heat radiation pattern hp1, and may circulate/conduct the heat absorbed from the heat radiation pattern hp1. Although the heat circulation pattern hs1 has been illustrated and described as being connected to any one heat radiation pattern hp1 among the heat radiation patterns hp1 and hp2, the heat circulation pattern hs1 may be also connected to the heat radiation pattern hp2. Although the heat radiation patterns hp1 and hp2 are illustrated as being separated from each other, the heat radiation patterns hp1 and hp2 may be also formed as a single pattern. The heat circulation pattern hs1 may have a "U"-shaped form to enable the circulation/conduction of heat absorbed by the heat radiation pattern hp1.

The element patterns or contact patterns may be located close to both sides of the heat circulation pattern hs1, and the thermistor element NTC1 may be soldered to the element patterns. The element patterns may also include via-hole patterns.

The insulation layer 120 may be disposed on the copper foil layer 110, and may form open regions so1, so2, so3, so4, so5 and so6 to allow the respective three-phase switch elements s1, s2, s3, s4, s5 and s6 to be soldered to the respective solder patterns sp1, sp2, sp3, sp4, sp5 and sp6. The insulation layer 120 may also form an open region no1 to allow each thermistor element NTC1 to be soldered to the respective element patterns.

Figure 3:
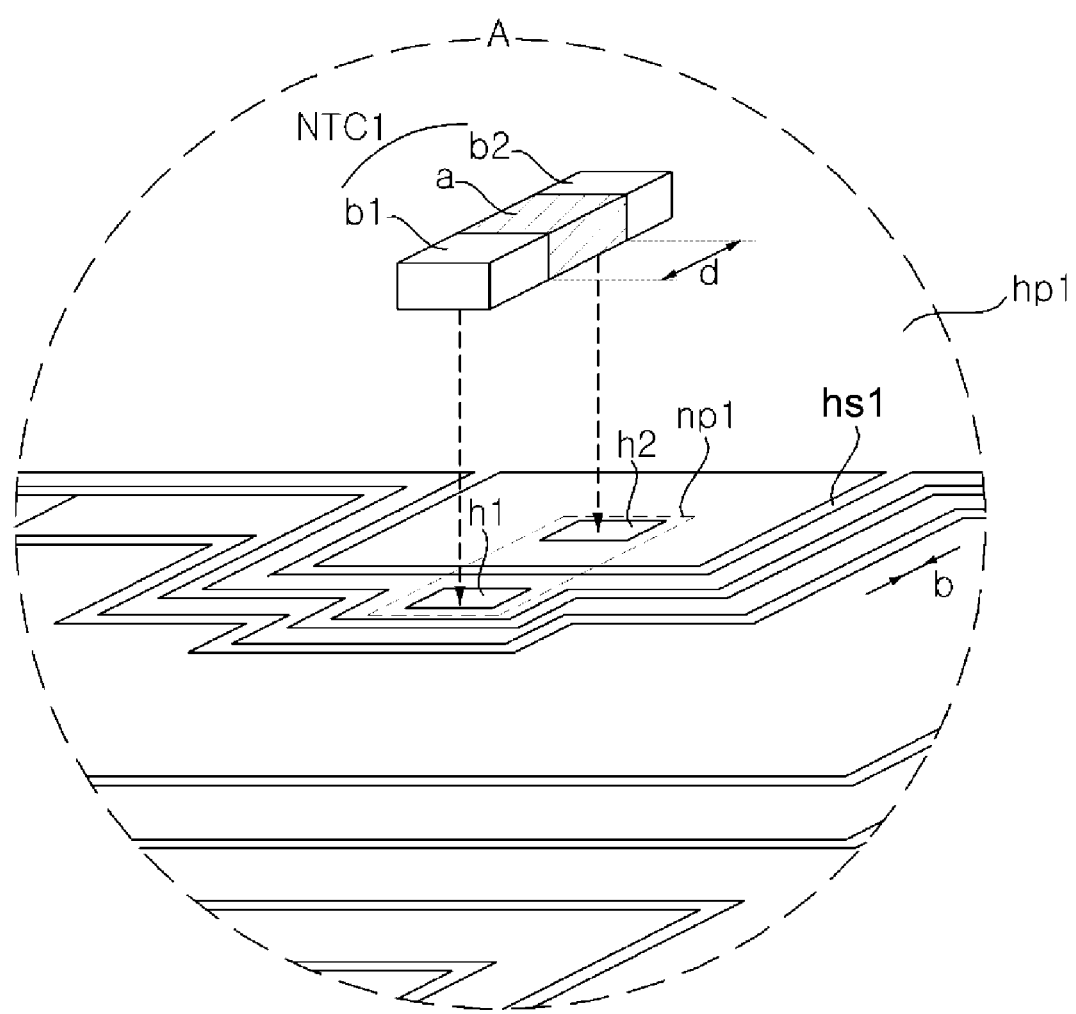
FIG. 3 is an enlarged view of the portion "A" illustrated in FIG. 2.

FIG. 3 is an enlarged view of the portion "A" illustrated in FIG. 2, and illustrates the heat radiation pattern hp1, the heat circulation/conduction pattern hs1, and the element/contact pattern np1. The thermistor element NTC1 may include first and second electrodes or conductive electrode portions b1 and b2, and an insulator or insulating portion a between the first and second electrode portions b1 and b2.

The thermistor element NTC1 will be described as being located between the second-phase and third-phase switch elements s2 and s3 among the three-phase switch elements s1, s2 and s3 so as to be close to the second-phase switch elements. The thermistor element NTC1 is located close to the second-phase switch element s2, and may achieve the advantage of simultaneously measuring heat in the second-phase switch element s2 and heat which is absorbed and circulated/conducted through the heat circulation pattern hs1. The first and second conductive electrode portions b1 and b2 may be soldered to the element pattern np1. The insulator portion a may vertically overlap the heat circulation pattern hs1 from the upper side thereof, and may indirectly react to the heat circulated through the heat circulation pattern hs1 such that the resistance value thereof may be varied.

The heat radiation pattern hp1 may absorb and radiate heat in the three-phase switch elements s1, s2 and s3 as described above with reference to FIGS. 1 and 2. The heat absorbed by the heat radiation pattern hp1 is conducted to the heat circulation pattern hs1, so as to be circulated through the heat circulation pattern hs1.

The element pattern np1 may include first and second via-hole patterns h1 and h2, to which the first and second electrode portions b1 and b2 are soldered, the first and second via-hole patterns h1 and h2 being formed through the base layer. The first and second via-hole patterns h1 and h2 may be formed through a first surface of the base layer and a second surface thereof, which is opposite to the first surface. The second surface of the base layer may be provided with a heat measurement pattern, which is connected to at least one of the first and second via-hole patterns h1 and h2 such that other elements are disposed on the heat measurement pattern to measure heat based on the variable resistance value of the thermistor element NTC1.

The width d of the insulator portion a or the distance between the first and second electrode portions b1 and b2 may be greater than the width b of the heat circulation pattern hs1. When the width d or the distance is less than the width b of the heat circulation pattern hs1, the first and second electrode portions b1 and b2 are at risk of forming a short-circuit due to the heat circulation pattern hs1.

In the printed circuit pattern 100 according to the embodiment, as a result of forming the heat circulation pattern hs1, through which the heat absorbed by the heat radiation pattern hp1 is circulated, and of forming the element pattern np1 such that the thermistor element NTC1 is disposed on the element pattern np1 so as to vertically overlap the heat circulation pattern hs1 from the upper side thereof, the abnormal operation of at least one of the three-phase switch elements s1, s2, s3, s4, s5 and s6 may be advantageously checked based on the thermal voltage measured by the NTC1 when the printed circuit board 100 is applied to a motor drive apparatus 200.

Figure 4:
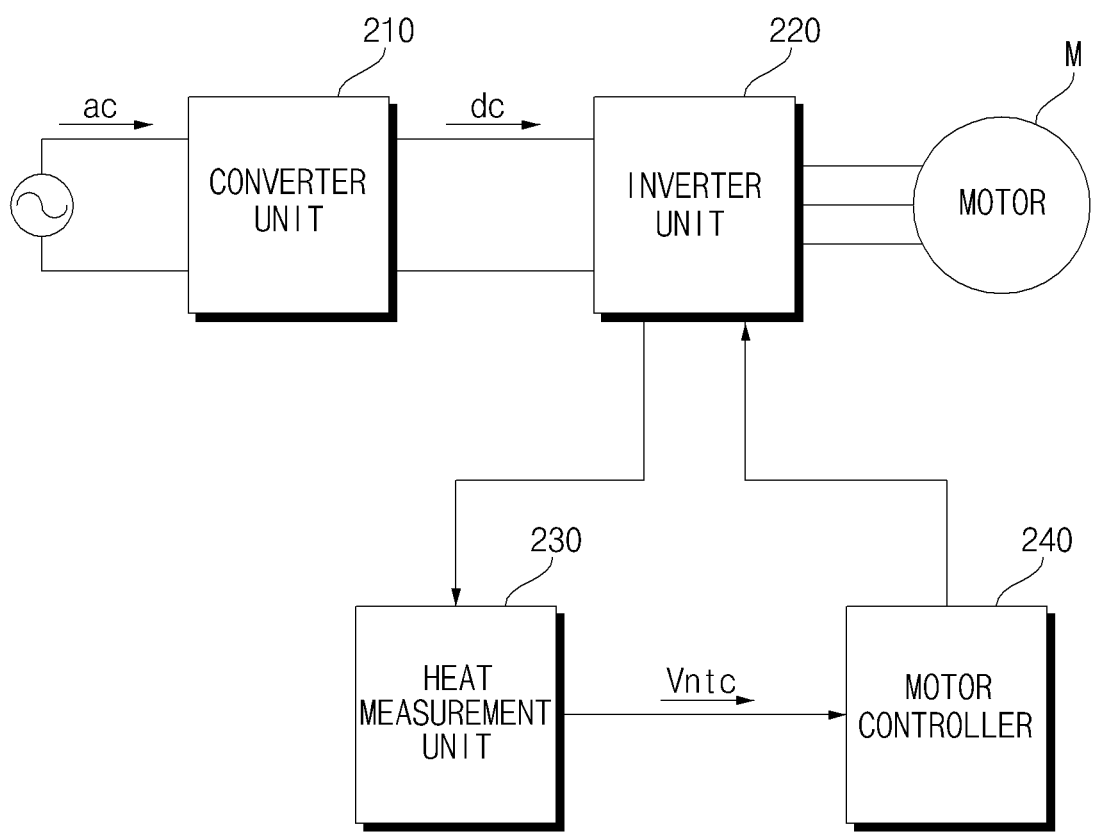
FIG. 4 is a control block diagram illustrating the control configuration of a motor drive apparatus according to an exemplary embodiment.
Figure 5:
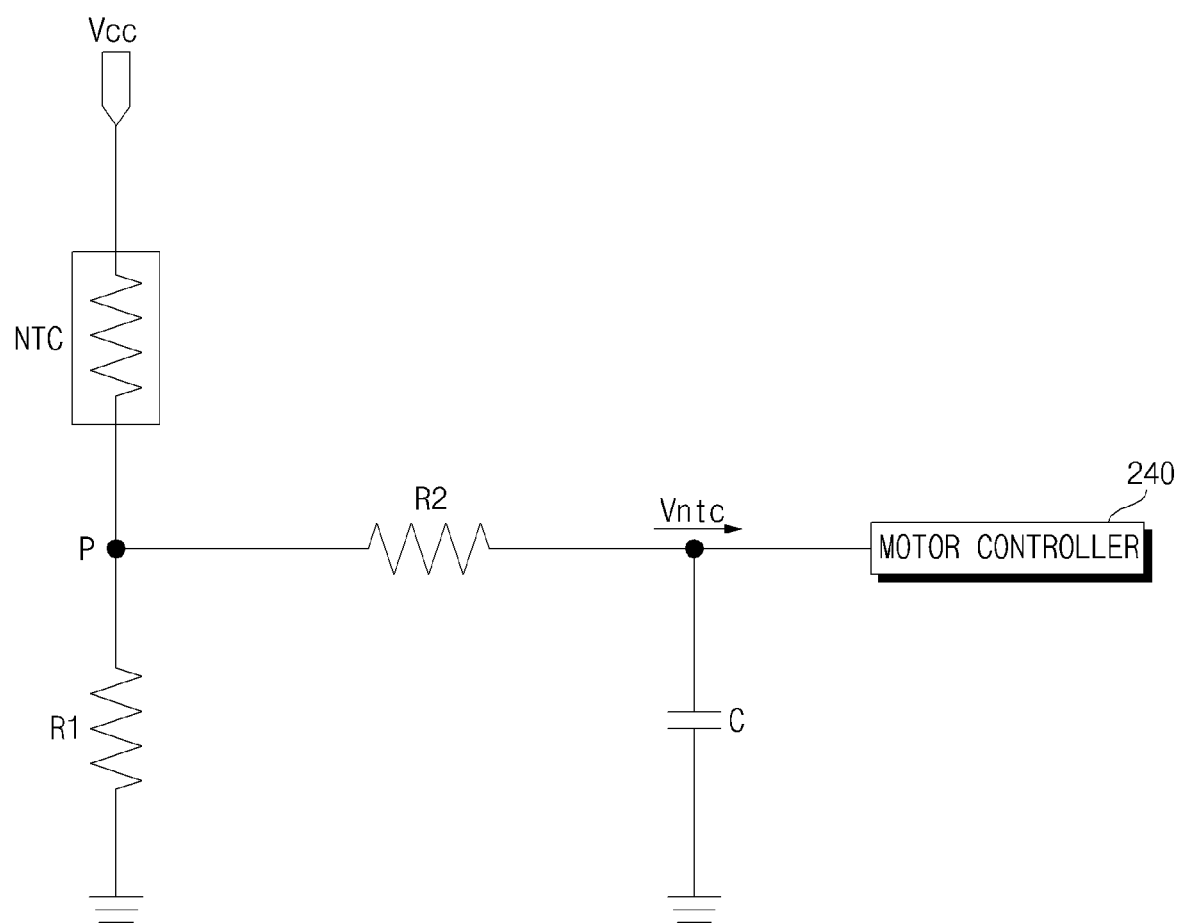
FIG. 5 is a circuit diagram illustrating a heat measurement unit of FIG. 4.

Referring to FIGS. 4 and 5, the motor drive apparatus 200 may include a converter or converter unit or module 210, an inverter or inverter unit or module 220, a heat measurement unit or module 230, and a motor controller 240. The converter unit 210 may include a rectifier circuit, which rectifies commercial power, i.e. converts AC power into DC power.

The inverter unit 220 may include the three-phase switch elements s1, s2, s3, s4, s5 and s6, which are soldered to the solder patterns sp1, sp2, sp3, sp4, sp5 and sp6 formed on the printed circuit board 100 as described above with reference to FIGS. 1 to 3, and come into contact, on at least one surface thereof, with the heat radiation patterns hp1 and hp2 which absorb and radiate heat, and supply drive power to a motor M. The three-phase switch elements s1, s2, s3, s4, s5 and s6 perform switching in response to gate signals applied from the motor controller 240, so as to output the drive power to the motor M.

The heat measurement unit 230 may be disposed on the heat circulation pattern hs1 connected to the heat radiation pattern hp1, and may output the thermal voltage Vntc, which corresponds to the heat circulated/conducted from the heat radiation pattern hp1 to the heat circulation pattern hs1. The heat measurement unit 230, as illustrated in FIG. 5, may include a thermistor element NTC, a reference resistor R1, and RC filters having a resistor R2 and a capacitor C.

The heat measurement unit 230 measures the thermal voltage Vntc of the thermistor element NTC1 illustrated in FIGS. 1 to 3. The thermistor element NTC may be soldered to the element pattern np1 formed on both sides of the heat circulation pattern hs1 on the printed circuit board 100, and may vertically overlap the heat circulation/conduction pattern hs1 from the upper side thereof. The resistance value of the thermistor element NTC decreases in proportion to the heat.

The reference resistor R1 may be connected to the thermistor element NTC in serial with a distribution contact or node p interposed therebetween. The RC filter R2 and C may be connected to the distribution contact p, and may remove noise from the voltage at the distribution contact p so as to output the thermal voltage Vntc to the motor controller 240.

The thermal voltage Vntc is a distribution voltage that is applied to the distribution contact p as a reference voltage Vcc is supplied to one side of the thermistor element NTC.

The thermal voltage Vntc may be variable as the resistance value of the thermistor element NTC is varied by heat, and may be calculated using the following Equation 1.

$$Vnct = (R1/(Rnct + R1))Vcc \qquad \text{Equation 1}$$

Here, Vntc indicates the thermal voltage of the thermistor element NTC, Rntc indicates the resistance value of the thermistor element NTC, R1 indicates the resistance value of the reference resistor, and Vcc indicates a reference voltage.

The resistance value Rntc of the thermistor element NTC is a resistance value that is varied by heat. For example, when the resistance value Rntc of the thermistor element NTC is 5 KΩ, the reference voltage Vcc is 5V, and the reference resistance R1 is 1 KΩ in a normal state, the thermal voltage Vntc is 4.16 V. However, when the resistance value Rntc of the thermistor element NTC decreases to 1 KΩ in a high temperature state, the thermal voltage Vntc may decrease to 2.5 V.

The motor controller 240 may control the inverter unit 220, and may control the driving of the motor M by comparing the thermal voltage Vntc output from the heat measurement unit 230 with a reference thermal voltage which is set to control the driving of the motor M.

When the thermal voltage Vntc is less than the reference thermal voltage, the motor controller 240 may judge that at least one of the three-phase switch elements s1, s2, s3, s4, s5 and s6 included in the inverter unit 220 is operating abnormally, and may control the three-phase switch elements s1, s2, s3, s4, s5 and s6 so as to stop the operation of the motor M.

The motor drive device 200 according to the embodiment may monitor the state of the three-phase switch elements s1, s2, s3, s4, s5 and s6 based on the thermal voltage Vntc corresponding to the heat in the three-phase switch elements s1, s2, s3, s4, s5 and s6, and may control the motor M so as to stop the operation of the motor M upon the abnormal operation of the switch element(s).

Figure 6:
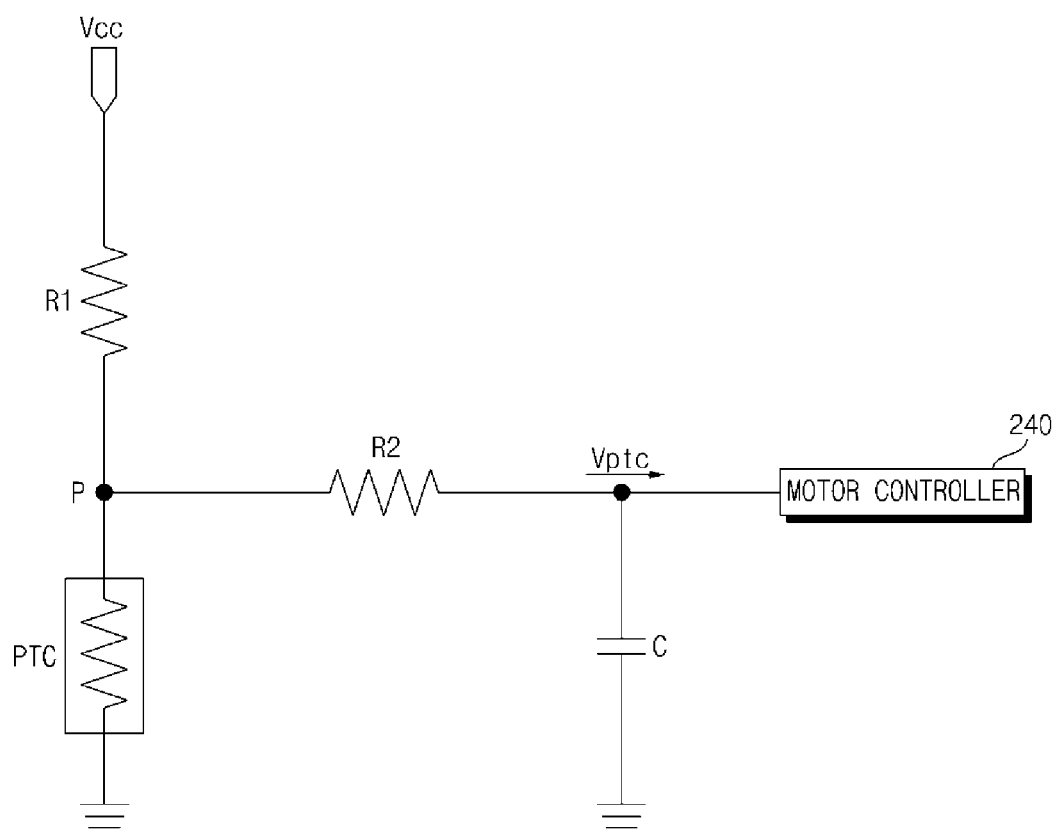
FIG. 6 is a circuit diagram illustrating a second embodiment of the heat measurement unit of FIG. 4.

FIG. 6 is a circuit diagram illustrating a second embodiment of the heat measurement unit of FIG. 4. FIG. 6, in which configurations that are the same as those of FIGS. 4 and 5 are not illustrated and described, is a diagram of a circuit that uses a PCT thermistor, which is different from the thermistor element of FIG. 5.

The heat measurement unit 230, as exemplarily illustrated in FIG. 6, may include the thermistor element PTC, the reference resistor R1, and the RC filter having resistor R2 and capacitor C. The thermistor element PTC may be soldered to the element pattern np1 formed on both sides of the heat circulation pattern hs1 on the printed circuit board 100, and may vertically overlap the heat circulation pattern hs1 from the upper side thereof.

The thermistor element PCT may be a PCT thermistor element, the resistance value of which increases in proportion to the heat. The reference resistor R1 may be connected to the thermistor element PTC in serial with the distribution contact or node p interposed therebetween. The RC filter R2 and C may be connected to the distribution contact or node p, and may remove noise from the distribution voltage applied to the distribution contact p so as to output the thermal voltage Vptc to the motor controller 240.

The thermal voltage Vptc is a distribution voltage that is applied to the distribution contact p by the resistance value of the thermistor element PCT as a reference voltage Vcc is supplied to one side of the reference resistor R1.

$$Vptc = \frac{Rptc}{(Rptc + R1)} Vcc \qquad \text{Equation 2}$$

Here, Vptc indicates the thermal voltage of the thermistor element PTC, Rptc indicates the resistance value of the thermistor element PTC, R1 indicates the resistance value of the reference resistor, and Vcc indicates a reference voltage.

The resistance value Rptc of the thermistor element PTC is a resistance value that is varied by heat, i.e., change in temperature. For example, when the resistance value Rptc of the thermistor element PTC is 1 KΩ, the reference voltage Vcc is 5V, and the reference resistance R1 is 1 KΩ in a normal state, the thermal voltage Vptc is 2.5 V. However, when the resistance value Rptc of the thermistor element PTC increases to 5 KΩ in a high temperature state, the thermal voltage Vptc may decrease to 0.833*5V=4.166.

The motor controller 240 may control the inverter unit 220, and may control the driving of the motor M by comparing the thermal voltage Vptc output from the heat measurement unit 230 with a reference thermal voltage which is set to control the driving of the motor M.

When the thermal voltage Vptc is less than the reference thermal voltage, the motor controller 240 may judge that at least one of the three-phase switch elements s1, s2, s3, s4, s5 and s6 included in the inverter unit 220 is operating abnormally, and may control the three-phase switch elements s1, s2, s3, s4, s5 and s6 so as to stop the operation of the motor M.

The motor drive device 200 according to the embodiment may monitor the state of the three-phase switch elements s1, s2, s3, s4, s5 and s6 based on the thermal voltage Vptc corresponding to the heat in the three-phase switch elements s1, s2, s3, s4, s5 and s6, and may control the motor M so as to stop the operation of the motor M upon the abnormal operation of the switch element(s).

As is apparent from the above description, in a printed circuit board and a motor drive apparatus including the printed circuit board, by providing a heat radiation pattern, which comes into contact with a single surface that is common to all of inverter switch elements so as to absorb and radiate heat in the inverter switch elements, a heat circulation pattern connected to the heat radiation pattern such that the heat absorbed by the heat radiation pattern is circulated through the heat circulation pattern, and an element pattern formed on the heat circulation pattern so as to allow a thermistor element to indirectly measure the heat, the heat in the switch elements may be advantageously measured in an indirect manner.

Embodiments provide a printed circuit board and a motor drive apparatus including the printed circuit board, in which a heat radiation pattern, to absorb and radiate heat in inverter switch elements, is formed on the printed circuit board, and a thermistor is disposed a heat circulation pattern, connected to the heat radiation pattern, so as to indirectly measure heat, thereby realizing the easy control of a motor.

In one embodiment, a printed circuit board includes a copper foil layer to form a circuit pattern on a base layer, and an insulation layer laminated on the copper foil layer, wherein the circuit pattern includes a solder pattern, to which an inverter switch element is soldered to supply drive power to a motor, a heat radiation pattern spaced apart from the solder pattern and to contact with one surface of the inverter switch element so as to absorb and radiate heat in the inverter switch element, a heat circulation pattern, through which the heat absorbed by the heat radiation pattern is circulated, and an element pattern formed on both sides of the heat circulation pattern to allow a thermistor element, a resistance value of which is varied according to the heat, to be soldered to the element pattern.

In another embodiment, a motor drive apparatus includes an inverter unit including three-phase switch elements each soldered to a solder pattern formed on a printed circuit board and in contact, on at least one surface thereof, with a heat radiation pattern, which absorbs and radiates heat, a heat measurement unit, which is disposed on a heat circulation pattern connected to the heat radiation pattern and outputs a thermal voltage corresponding to heat circulated from the heat radiation pattern to the heat circulation pattern, and a motor controller to control the three-phase switch elements such that a motor, which is driven by drive power supplied from the inverter unit, stops operation by comparing the thermal voltage with a reference thermal voltage set to control driving of the motor.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure.

Any reference in this specification to "one embodiment," "an embodiment," "example embodiment," etc., means that a particular feature, structure, or characteristic described in connection with the embodiment is included in at least one embodiment of the disclosure. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A motor drive apparatus comprising:
   an inverter including three-phase switches, each soldered to a solder pattern formed on a printed circuit board and provided over at least one surface of a heat radiation pattern, which absorbs and radiates heat generated from the three-phase switches;
   a heat measurement module, which is provided over a heat conduction pattern connected to the heat radiation pattern and outputs a thermal voltage based on heat transferred from the heat radiation pattern to the heat conduction pattern; and
   a motor controller to control the three-phase switches such that a motor, which is driven by drive power supplied from the inverter, stops operation based on the thermal voltage relative to a reference thermal voltage,
   wherein the heat measurement module includes:
      a thermistor soldered to a contact pattern formed on both sides of the heat conduction pattern on the printed circuit board, the thermistor being disposed over the heat conduction pattern so as to vertically overlap the heat conduction pattern, a first electrode of the thermistor configured for coupling to a reference voltage;
      a reference resistor having a first electrode coupled to a second electrode of the thermistor at a distribution node, and a second electrode configured for coupling to a ground; and
      an RC filter coupled to the distribution node and configured to remove noise from a distribution voltage at the distribution node and to output the thermal voltage to the motor controller.

2. The motor drive apparatus according to claim 1, wherein the thermistor is an NTC thermistor, a resistance value of which decreases as temperature rises based on radiated heat of the heat conduction pattern.

3. The motor drive apparatus according to claim 1, wherein the motor controller switches off the three-phase switch elements such that operation of the motor stops when the thermal voltage is less than the reference thermal voltage.

4. A motor drive apparatus,
   an inverter including three-phase switches, each soldered to a solder pattern formed on a printed circuit board and provided over at least one surface of a heat radiation pattern, which absorbs and radiates heat generated from the three-phase switches;
   a heat measurement module, which is provided over a heat conduction pattern connected to the heat radiation pattern and outputs a thermal voltage based on heat transferred from the heat radiation pattern to the heat conduction pattern; and
   a motor controller to control the three-phase switches such that a motor, which is driven by drive power supplied from the inverter, stops operation based on the thermal voltage relative to a reference thermal voltage,
   wherein the heat measurement module includes:
      a thermistor soldered to a contact pattern formed on both sides of the heat conduction pattern on the printed circuit board, the thermistor being provided over the heat conduction pattern so as to vertically overlap the heat circulation pattern;
      a reference resistor having a first electrode configured to receive a reference voltage, and a second electrode connected to a first electrode of the thermistor element at a distribution node; and
      an RC filter coupled to the distribution node and configured to remove noise from a distribution voltage at the distribution node and to output the thermal voltage to the motor controller.

5. The motor drive apparatus according to claim 4, wherein the thermistor element is a PCT thermistor, a resistance value of which increases as temperature rises based on radiated heat of the heat conduction pattern.

6. A motor drive apparatus comprising:
   an inverter including three-phase switches, each soldered to a solder pattern formed on a printed circuit board and provided over at least one surface of a heat radiation pattern, which absorbs and radiates heat generated from the three-phase switches;
   a heat measurement module, which is provided over a heat conduction pattern connected to the heat radiation pattern and outputs a thermal voltage based on heat transferred from the heat radiation pattern to the heat conduction pattern; and
   a motor controller to control the three-phase switches such that a motor, which is driven by drive power supplied from the inverter, stops operation based on the thermal voltage relative to a reference thermal voltage,
   wherein the heat measurement module includes a thermistor soldered to a contact pattern formed on both sides of the heat conduction pattern on the printed circuit board, the thermistor being disposed over the heat circulation pattern so as to vertically overlap the heat conduction pattern, a resistance value of the thermistor being varied in proportion to the heat, and wherein the thermistor is located close to one switch among the three-phase switches.

7. The motor drive apparatus according to claim 6, wherein the three-phase switches include a first-phase switch, a third-phase switch, and a second-phase switch located between the first-phase switch and the third-phase switch and wherein the thermistor is located closer to the second-phase switch.

8. The motor drive apparatus according to claim 6, wherein the thermistor includes first and second electrodes, and an insulator between the first and second electrodes, and wherein the insulator of the thermistor overlaps the heat conduction pattern.

9. The motor drive apparatus according to claim 8, wherein a width of the insulator in a first direction is greater than a width of the heat conduction pattern in the first direction.

* * * * *